United States Patent [19]
Honnigford et al.

[11] Patent Number: 5,734,186
[45] Date of Patent: Mar. 31, 1998

[54] CMOS VOLTAGE CLAMP

[75] Inventors: Edward Herbert Honnigford, Russiaville; Tracy Adam Noll, Kokomo, both of Ind.; Jack Duane Parrish, Round Rock, Tex.

[73] Assignee: Delco Electronics Corporation, Kokomo, Ind.

[21] Appl. No.: 715,284

[22] Filed: Sep. 16, 1996

[51] Int. Cl.$^6$ ...................................... H01L 23/62
[52] U.S. Cl. .............................. 257/360; 257/357
[58] Field of Search .......................... 257/356, 357, 257/360, 361, 362

[56] References Cited

U.S. PATENT DOCUMENTS 4,987,465  1/1991  Longcor et al. ................ 357/23.13

*Primary Examiner*—Sara W. Crane
*Attorney, Agent, or Firm*—Jimmy L. Funke

[57] ABSTRACT

An IC voltage clamp and a process for forming the voltage clamp. The voltage clamp includes an MGFO device having an n-type source region, an n-type drain region, and a p-type field implant diffusion between the source and drain regions. The voltage clamp further employs a parasitic NPN device having a collector region coincident with the MGFO drain region, an emitter region coincident with the MGFO source region, and a base region formed by the substrate. A metal gate electrode overlies and is insulated from the field implant diffusion, but electrically connects the source and emitter regions to ground. An input electrode contacts the drain region so as to electrically connect the drain and collector regions to the input voltage of an integrated circuit. The field implant diffusion and drain/collector regions are formed by overlapping their masks, such that a lower breakdown voltage is achieved between the NPN collector and the substrate and field implant diffusion (the NPN base). The voltage clamp is capable of withstanding electrostatic discharge pulses of greater than about 8000 Vdc, and is particularly adapted for use in protecting a CMOS IC that operates at high voltages, such as automotive battery voltages with 40 Vdc transients, without interfering with the operation of the IC.

9 Claims, 2 Drawing Sheets

CMOS VOLTAGE CLAMP

FIELD OF THE INVENTION

The present invention generally relates to semiconductor devices and their processing methods. More particularly, this invention relates to an improved voltage clamp capable of protecting a CMOS integrated circuit that operates at relative high voltages, such as automotive battery voltages, whereby the voltage clamp protects the CMOS integrated circuit from electrostatic discharge yet does not interfere with the operation of the integrated circuit at the intended voltage and any associated transient voltages.

BACKGROUND OF THE INVENTION

Due to the sensitive nature of CMOS integrated circuits (IC's), a concern with designing a CMOS IC is providing adequate protection of the IC from electrostatic discharges (ESD) that might damage the gate oxides and junctions of the IC. A countervailing consideration is that a device, termed a "voltage clamp," designed to protect the IC must not interfere with the operation of the IC under tolerated voltage conditions, yet must respond in such a way as to reliably protect the IC if such tolerated voltage conditions are exceeded.

FIG. 1 represents a schematic of a voltage clamp 10 that includes a metal gate field oxide (MGFO) transistor 12 and a parasitic NPN transistor 14. The MGFO and NPN transistors 12 and 14 are connected between an input pad 16 and a ground node of a CMOS IC 18. As shown, the MGFO transistor 12 is connected in the "OFF" state, i.e., with its gate and source grounded and its drain connected to the input pad 16. The NPN transistor 14 is also normally "OFF," with its emitter and base tied to ground and its collector tied to the input pad 16. The MGFO transistor 12 establishes the spacings and dimensions of the parasitic NPN transistor 14. With positive ESD voltages, the MGFO transistor 12 behaves as a parasitic NPN. With negative ESD voltages, the MGFO transistor 12 behaves as an NMOS transistor.

A cross-sectional representation is illustrated in FIG. 2A of a prior art voltage clamp 10a embodying the circuitry of FIG. 1. The voltage clamp 10a is formed in a silicon substrate 20 doped p-type, which is tied to ground 32 through a p-type region 36. Formed in the substrate 20 are an n-well 22, a field implant diffusion 24 doped p-type, a field oxide 28 overlying the field implant diffusion 24, and two regions 26 and 30 doped n-type, the latter of which is formed in the n-well 22. Finally, a metal gate electrode 34 tied to ground 32 overlies the field oxide 28 and contacts the first n-type region 26, while an input pad electrode 16a of a CMOS transistor (not shown) contacts the second n-type region 30. With this structure, an MGFO transistor is defined having a source region formed by the first n-type region 26, a drain region formed by the n-well 22, and a gate formed by the metal gate electrode 34, while an NPN transistor is defined having an emitter region also formed by the first n-type region 26, a collector region formed by the n-well 22, and a base region formed by the substrate 20 and the field implant diffusion 24. With the above, the first n-type region 26 (the MGFO source and the NPN emitter) is tied to ground 32, and the second n-type region 30 provides ohmic contact to the n-well 22 (the MGFO drain and NPN collector) for the input pad 16a.

The n-well 22 and the substrate 20 define an np junction 50 therebetween, and the field implant diffusion 24 increases the p-type carrier (hole) concentration in the field areas and thus raises the field threshold of the MGFO transistor and the collector-to-emitter breakdown voltage of the NPN transistor. Prior art layout practice dictates that the mask 38 for the field implant 40 (FIG. 2C) is laterally offset about 1.2 micrometers from the mask 42 for the n-well implant 44 (FIG. 2B), as seen by the placement of the field implant 40 relative to the n-well implant 44, the latter of which is shown in phantom in FIG. 2C. During diffusion of the n-well implant 44 to form the n-well 22, the concentration of electrons in the n-well 22 decreases as the junction 50 is approached. As a result, subsequent diffusion of the field implant 40 creates a lightly-doped region at the np junction 50 between the field implant diffusion 24 and the n-well 22, shown in FIG. 2A. The lightly-doped region is defined by that portion of the field implant diffusion 24 that overlaps the n-well 22 by no more than about 2 micrometers for the purpose of preventing premature breakdown of the np junction 50. If the voltage at the input pad 16a exceeds the collector-to-base breakdown voltage of the NPN transistor, the NPN transistor goes into an avalanche condition by which excess voltage at the input pad 16a is conducted and shunted through the substrate 20 to the first n-type region 26 and ground 32.

The suitability of a voltage clamp for a given application depends in part on the operating voltage of the IC to be protected. A particularly challenging application is CMOS IC's that operate at 12 volts dc (Vdc) off the battery supply of an automobile. Automobile battery voltages are defined herein as "high voltages" in order to be distinguished from "low voltage" automotive applications that operate at 5 Vdc and less. A complicating factor of high voltage applications is that automotive batteries have associated low-impedance transient voltages of about 40 Vdc (possibly higher transients are possible, but are less destructive due to a higher impedance), while the gate oxides for CMOS IC's used in these applications typically have rupture voltages of about 62 Vdc. Therefore, to prevent its destruction by low-impedance transients, a voltage clamp must tolerate certain transient voltages (e.g., about 40 Vdc), yet prevent higher voltages (e.g., about 62 Vdc) from reaching the CMOS IC. Prior art voltage clamps of the type shown in FIG. 2A exhibit collector-to-base breakdown voltages exceeding the gate oxide rupture voltage (about 62 Vdc) of CMOS devices operating at high voltages, and have therefore been unable to protect these devices.

Accordingly, what is needed is a voltage clamp that is reliably capable of protecting CMOS IC's employed in high voltage applications, such as IC's that operate at automotive battery voltages with 40 Vdc transients, without interfering with the operation of the IC at such voltages. Such a voltage clamp would preferably not entail processing that conflicts with or otherwise unduly complicates conventional processing employed to produce integrated circuits.

SUMMARY OF THE INVENTION

It is an object of this invention to provide a voltage clamp for protecting an integrated circuit that operates at high voltages.

It is a further object of this invention that such a voltage clamp can be processed in a manner that does not complicate processing of the integrated circuit.

It is another object of this invention that such a voltage clamp reliably protects the integrated circuit without interfering with the intended operation of the circuit.

It is yet another object of this invention that such a voltage clamp exhibits an enhanced voltage capability, and can therefore survive higher electrostatic discharges than that possible with prior art voltage clamps of a similar construction.

In accordance with a preferred embodiment of this invention, these and other objects and advantages are accomplished as follows.

According to the present invention, there is provided an IC voltage clamp and a process for forming the voltage clamp. The voltage clamp is particularly adapted for use in protecting a CMOS IC that operates at high voltages, such as automotive battery voltages with 40 Vdc transients, without interfering with the operation of the IC. Finally the voltage clamp employs the same processing steps employed in the processing of prior art voltage clamps, such as that shown in FIG. 2A, yet exhibits an enhanced voltage capability that enables the voltage clamp to survive higher electrostatic discharges than that possible with the prior art.

Generally, the voltage clamp of this invention includes an MGFO device and a bipolar device formed in a substrate. In a preferred embodiment, the former is an n-channel MGFO transistor and the latter is an NPN transistor, though those skilled in the art will recognize that opposite polarities (doping with opposite impurity types) might be specified for certain applications. The preferred MGFO device includes an n-type source region, an n-well drain region, and a p-type field implant diffusion between the source and drain regions, such that the source and drain regions are separated by the field implant diffusion. The preferred NPN device is formed to include a collector region coinciding with the drain region of the MGFO device, an emitter region coinciding with the source region of the MGFO device, and a base region formed by the substrate and the field implant diffusion. A metal gate electrode overlies and is insulated from the field implant diffusion, but electrically connects the source/emitter region and substrate to ground. An input electrode electrically connects the drain/collector region to the input voltage of an integrated circuit.

With the above structure, the n-well and the substrate define a collector-to-base np junction therebetween. According to this invention, the field implant diffusion is formed using a field implant mask that overlaps the mask used to form the n-well. In so doing, the field implant is overlapped with the original placement of the n-well implant such that, after diffusion of the field implant, a heavier concentration of carriers (holes) is present at the junction formed by the field implant diffusion and n-well. The resulting concentration of carriers reduces the breakdown voltage between the n-well (the NPN collector) and the substrate and field implant diffusion (the NPN base). According to this invention, overlapping the field implant and the n-well implant by about 1.2 micrometers causes the field implant diffusion and the n-well to overlap by about 4.4 micrometers, resulting in a breakdown voltage of more than 40 Vdc but less than 62 Vdc. In addition, the resulting voltage clamp has been shown to withstand electrostatic discharge pulses of greater than about 8000 Vdc.

As noted above, the voltage clamp of this invention can be fabricated with the use of processing techniques that are compatible with that used to form the CMOS IC intended to be protected. Generally, the n-well (the NPN collector) is formed in the substrate (the NPN base), after which two n-type regions (the MGFO source and NPN emitter, and the MGFO drain) and the p-type field implant diffusion are formed in the substrate, such that the field implant diffusion is between the first n-type region (the MGFO source and NPN emitter) and the n-well (the MGFO drain and NPN collector) and, as described above, the field implant diffusion overlaps the n-well. The required field oxide for the MGFO gate is formed over the field implant diffusion prior to formation of the n-doped regions, after which the metal gate electrode is formed over the field oxide such that the gate electrode electrically connects the first n-type region (the MGFO source and NPN emitter) to ground, and the input electrode is formed which contacts the second n-type region so as to connect the n-well (the MGFO drain and NPN collector) to the integrated circuit.

Importantly, and as discussed previously, the field implant mask intentionally results in the field implant overlapping the n-well implant, such that the field implant diffusion extends through what would otherwise be the collector-to-base junction with the n-well, so as to yield a breakdown voltage of at least 40 Vdc for the voltage clamp. Such a step is contrary to prior art layout practices, which dictate spacing the field implant apart from the n-well implant to create a standoff that prevents premature breakdown of the np junction. However, by intentionally overlapping the field and n-well implants by appropriately sizing and placing their respective masks, diffusion of these implants yields a voltage clamp whose breakdown voltage is higher than the 40 Vdc transients associated with automotive batteries, but less than the 62 dc voltage at which CMOS gate oxides rupture. Finally, and as noted above, an additional benefit of the resulting overlap between the field implant diffusion and the n-well is that the voltage clamp is capable of withstanding electrostatic discharge pulses of greater than 8000 Vdc.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 1:
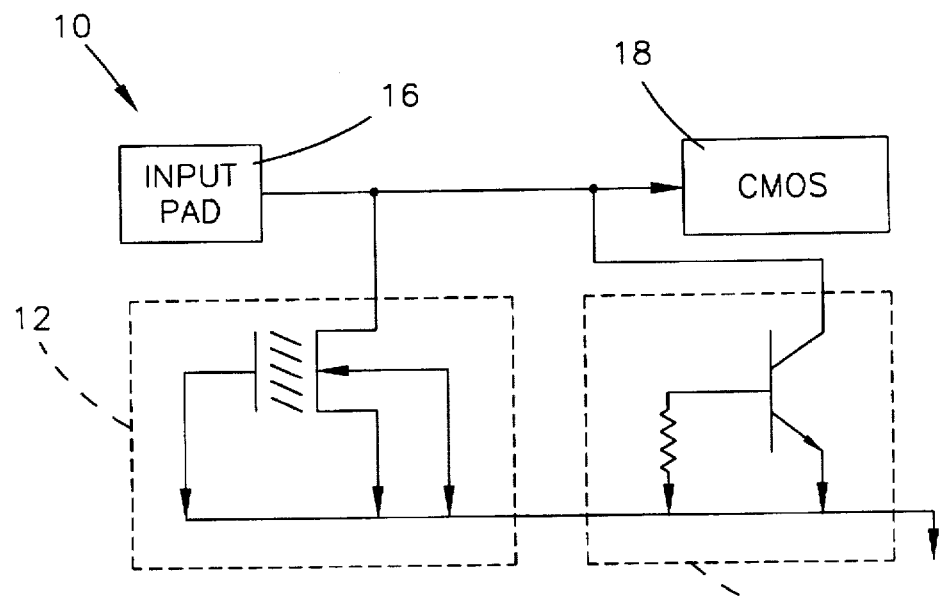
FIG. 1 is a schematic representation of a voltage clamp incorporating MGFO and NPN transistors.
Figure 2A:
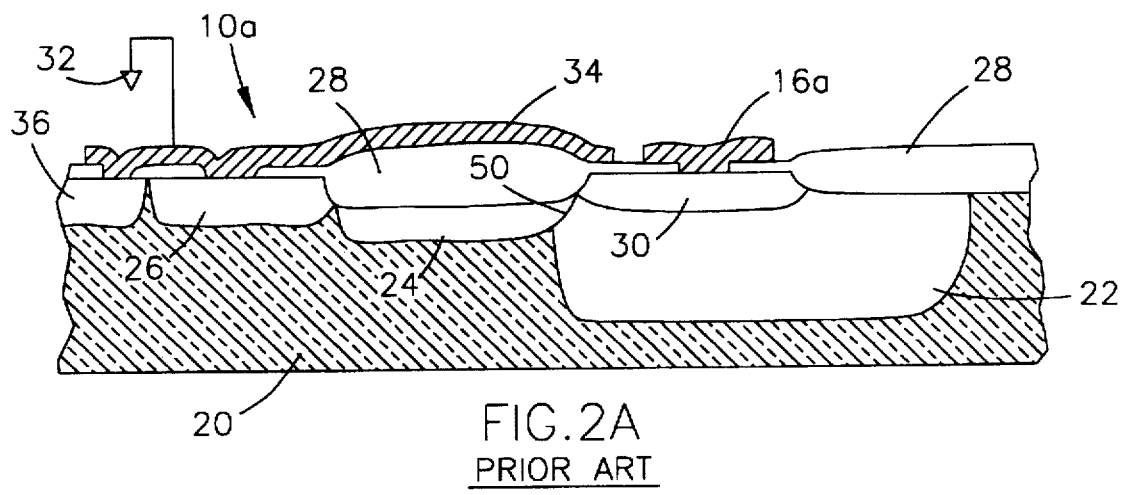
FIG. 2A is a cross-sectional representation of a prior art voltage clamp that includes MGFO and NPN transistors in accordance with FIG. 1.
Figure 3A:
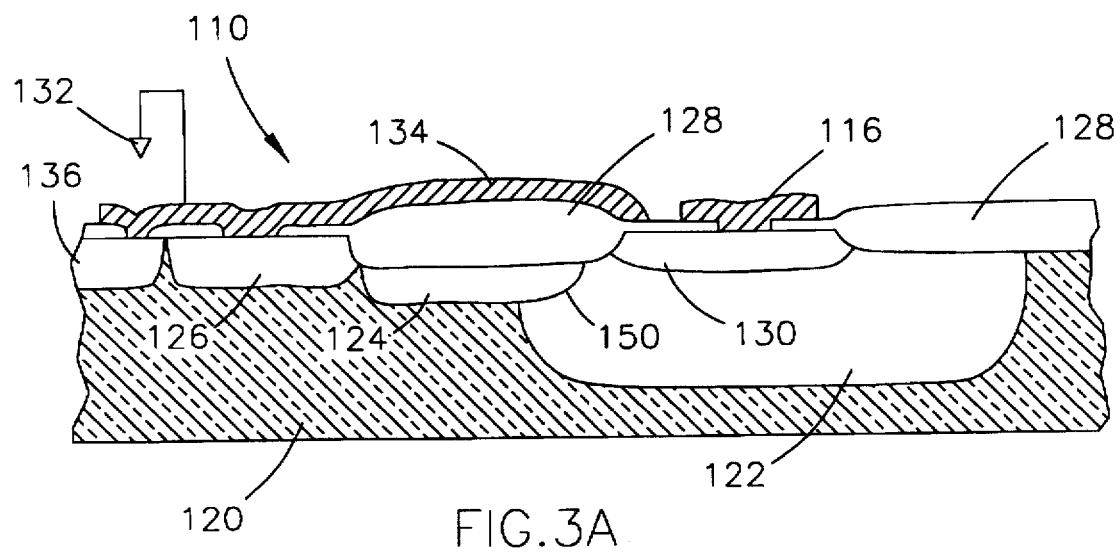
FIG. 3A is a cross-sectional representation of a voltage clamp which also includes MGFO and NPN transistors as shown in FIG. 1, but having a modified collector-to-base junction in accordance with the present invention.

Illustrated in FIG. 3A is a solid state voltage clamp 110 which embodies the circuit 10 shown in FIG. 1, yet exhibits superior operating characteristics as compared to the prior art voltage clamp 10a of FIG. 2A. Similar to the voltage clamp 10a, the voltage clamp 110 of this invention is composed of an n-channel metal gate field oxide (MGFO) transistor and a parasitic NPN transistor coexisting in a p-type substrate 120. An n-well 122, a field implant diffusion 124 doped p-type, a field oxide 128 overlying the field implant diffusion 124, and a first region 126 doped n-type are formed in the substrate 120, which is tied to ground 132 through a p-type region 136. A second n-type region 130 is formed in the n-well 122. Finally, a metal gate electrode 134 tied to ground 132 overlies the field oxide 128 and contacts the first n-type region 126 and p-type region 136, while an input pad electrode 116 contacts the second n-type region 130.

As shown, the MGFO transistor has a source region formed by the first n-type region 126, a drain region formed by the n-well 122, an ohmic contact formed by the second n-type region 130, and a gate formed by the gate electrode 134, while the NPN transistor has an emitter region formed by the first n-type region 126 (and therefore coincident with the MGFO source region), a collector region formed by the n-well 122 (and therefore coincident with the MGFO drain region), and a base region formed by the substrate 120 and the field implant diffusion 124. In view of the above, the first n-type region 126 (the MGFO source and the NPN emitter) is tied to ground 132, and the n-well 122 (the MGFO drain and the NPN collector) are connected by the input pad 116 to a CMOS transistor (not shown).

As with the prior art voltage clamp 10a of FIG. 2A, the n-well 122 and the substrate 120 of the voltage clamp 110 define a collector-to-base np junction, while the field implant diffusion 124 increases the p-type carrier (hole) concentration in the field areas and thus raises the field threshold of the MGFO transistor. According to this invention, a unique layout technique combined with otherwise conventional CMOS process steps are employed to reduce the breakdown voltage of the voltage clamp 110 to a level that permits transient voltages of 40 Vdc to pass through to the protected CMOS IC, while shunting to ground (via the substrate 120) voltages that exceed acceptable transient voltages (e.g., 40 Vdc) but are less than the gate oxide rupture voltage (e.g., 62 Vdc) of the CMOS IC.

Figure 3B:
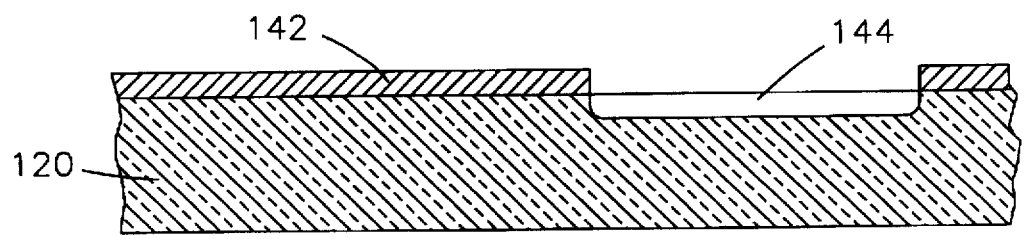
FIGS. 3B and 3C represent processing steps for the voltage clamp of FIG. 3A.
Figure 3C:
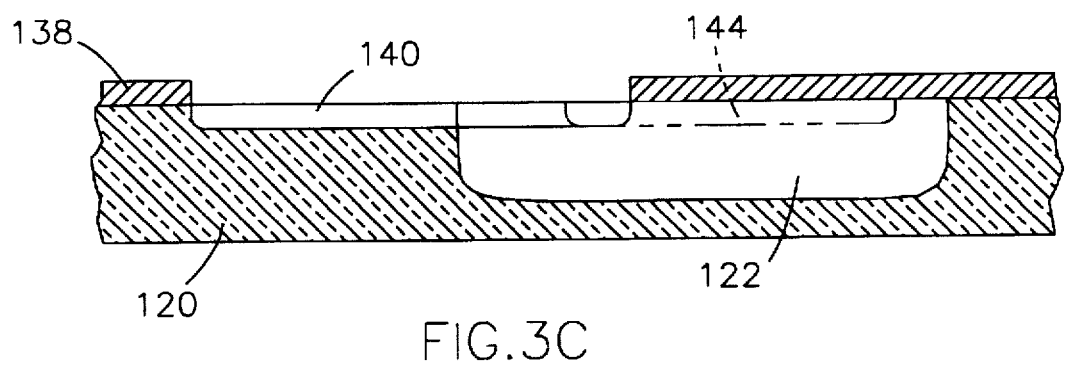

The above aspect of this invention is achieved by intentionally overlapping the mask 142 for the implant 144 of the n-well 122 (FIG. 3B) with the mask 138 for the implant 140 of the field implant diffusion 124 (FIG. 3C), i.e., a portion of the field implant 140 is intentionally implanted into a portion of the n-well 122 corresponding to the original n-well implant 144 (shown in phantom in FIG. 3C). After diffusion of the field implant 140, the field implant diffusion 124 sufficiently overlaps the n-well 122 to intentionally achieve a heavier concentration of carriers (holes) in the more heavily-doped n-well 122 at a final junction 150 between the NPN collector (n-well 122) and the NPN base (substrate 120). The final junction 150 is characterized by a heavier concentration of holes and electrons than the junction 50 of the prior art voltage clamp 10a. As such, the breakdown voltage of the NPN transistor and therefore the threshold voltage of the voltage clamp 110 are reduced.

In practice, it has been determined that overlapping the field implant mask 138 and the n-well mask 142 by about 1.2 micrometers produces a heavily-doped region defined by that portion of the field implant diffusion 124 that overlaps the n-well 122 by about 4.4 micrometers. Such an overlap yields a breakdown voltage of about 50 Vdc, which is greater than the 40 Vdc transients associated with automotive batteries, but less than the typical 62 Vdc gate oxide rupture voltage noted for CMOS IC's that operate on automotive battery line voltages. As an additional advantage of this invention, the voltage clamp 110 has been shown to withstand electrostatic discharge pulses of greater than about 8000 Vdc as determined by the "human body model," as described in Automotive Electronics Council document number CDF-AEC-Q100-002-REV-A. This aspect of the invention is also the result of the considerable overlap between the field implant diffusion 124 and the n-well 122, which allows the n-well 122 to be spaced closer to the first n-type region 126 (the MGFO source and the NPN emitter) without causing input pad leakage to ground 132. Also, the NPN base width is decreased and the current gain of the NPN transistor is increased, such that the maximum electrostatic discharge voltage capability of the voltage clamp 110 is significantly increased.

Figure 2B:
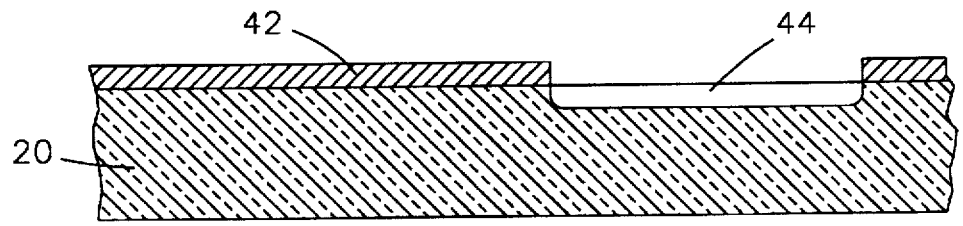
FIGS. 2B and 2C represent processing steps for the voltage clamp of FIG. 2A.
Figure 2C:
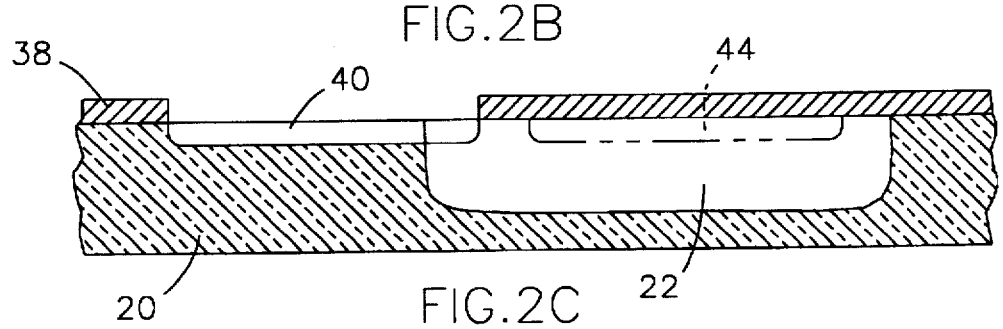

The process for forming the voltage clamp 110 of FIG. 3A basically employs the same processing techniques as would be performed to produce the voltage clamp 10a of FIG. 2A. Generally, the n-well 122 is formed in the substrate 120 by implanting, shown in FIG. 3B, followed by a diffusion step, the results of which are represented in FIG. 3C. Afterwards, the first and second n-type regions 126 and 130 (the MGFO source and NPN emitter, and the ohmic contact to the MGFO drain, respectively) and the p-type field implant diffusion 124 are formed in the substrate 120, each by implanting the substrate 120 with appropriate dopants, followed by an appropriate diffusion step as known in the art. In the prior art (FIGS. 2A-2C), the n-well implant mask 42 is drawn, for example using CAD equipment, and the field implant mask 38 is generated by duplicating, oversizing and making an opposite contrast of the n-well mask 42. This prior art practice of oversizing the field implant mask 38 creates the traditional placement of the n-well 22 and field implant diffusion 24 during processing. However, according to this invention, the field implant mask 138 is also preferably drawn or otherwise uniquely generated for the clamp 110, to yield an intentional overlap between the field implant 140 and n-well implant 144. Near the completion of the circuit layout, the drawn field is merged with the generated field data for the rest of the IC to create the total field implant mask, as would be understood by those skilled in the art.

Following the above, the field implant diffusion 124 and the n-well 122 are characterized by the approximately 4.4 micrometer overlap illustrated in FIG. 3A. Thereafter, the required field oxide 128 for the MGFO gate oxide is formed over the field implant diffusion 124, after which the gate electrode 134 is formed over the field oxide 128 such that the gate electrode 134 electrically connects the first n-type region 126 (the MGFO source and NPN emitter) to ground 132, and the input electrode 116 is formed to contact the second n-type region 130, which thereby forms an ohmic contact that connects the n-well 122 (the MGFO drain and NPN collector) to the integrated circuit.

Importantly, this invention enables the breakdown voltage of the voltage clamp 110 to be tailored using established processing techniques without requiring additional process steps. The implant overlap technique is not an additional step, but is instead a modification of the field implant mask used to produce the clamp 110 for a CMOS IC. As such, the present invention avoids techniques that might otherwise be employed to tailor the breakdown voltage, such as controlling the concentration of the field and n-well implants and/or controlling the field oxidation growth cycle, all of which would undesirably complicate the processing of the voltage clamp 110 and its corresponding CMOS IC.

From the above, it can be seen that a significant advantage of this invention is that, due to the field implant diffusion 124 being formed to extend into the n-well 122 at the collector-to-base junction, a breakdown voltage of about 50 Vdc can be obtained for the voltage clamp 110. Such a step is contrary to prior art layout practices, which would dictate that the field implant 140 be spaced apart from the n-well implant 144 to create a standoff that prevents premature breakdown of the np junction. However, by intentionally overlapping the field implant 140 and the n-well implant 144 by an appropriate amount, the process of this invention yields a voltage clamp 110 whose breakdown voltage is higher than voltage transients associated with automotive batteries, but less than voltages at which CMOS gate oxides rupture. Finally, an additional benefit of the resulting overlap between the field implant diffusion 124 and the n-well 122 is that the voltage clamp 110 is capable of withstanding electrostatic discharge pulses of greater than about 8000 Vdc.

In addition to the operational advantages of the voltage clamp 110 of this invention, another important advantage of this invention is that such operational benefits are achieved without resorting to processing techniques that would complicate processing of the voltage clamp 110 and its CMOS IC.

While our invention has been described in terms of a preferred embodiment, it is apparent that other forms could be adopted by one skilled in the art. Accordingly, the scope of our invention is to be limited only by the following claims.

The embodiments of the invention in which an exclusive property or privilege is claimed are defined as follows:

1. A voltage clamp of an integrated circuit for which the voltage clamp operates to shunt to ground any integrated circuit input voltage that exceeds a breakdown voltage of the voltage clamp, the voltage clamp comprising:

a substrate;

an MGFO device formed in the substrate and having a channel, the MGFO device having a source region, a drain region formed by a well region, and a field implant diffusion between the source and drain regions such that the source and well regions are separated by the field implant diffusion;

a bipolar device formed in the substrate, the bipolar device having a collector region formed by the well region, an emitter region formed by the source region, and a base region formed by the field implant diffusion and the substrate;

a metal gate electrode overlying the field implant diffusion, the metal gate electrode being electrically insulated from the field implant diffusion and electrically contacting the source and emitter regions so as to connect the source and emitter regions to ground; and an input electrode contacting the drain region so as to electrically connect the drain region and the collector region to the input voltage of the integrated circuit;

wherein the well region and the substrate define a junction therebetween and the field implant diffusion and the well region overlap at the junction so as to yield a breakdown voltage for the voltage clamp of at least 40 Vdc.

2. A voltage clamp as recited in claim 1 wherein the field implant diffusion and the well region overlap at the junction by about 4.4 micrometers.

3. A voltage clamp as recited in claim 1 wherein the breakdown voltage of the voltage clamp is less than 62 Vdc.

4. A voltage clamp as recited in claim 1 wherein the integrated circuit is a CMOS integrated circuit.

5. A voltage clamp as recited in claim 1 wherein the voltage clamp withstands an electrostatic discharge pulse of at least 8000 Vdc.

6. A voltage clamp of a CMOS integrated circuit for which the voltage clamp operates to shunt to ground any integrated circuit input voltage that exceeds a breakdown voltage of the voltage clamp, the voltage clamp comprising:

a p-type substrate;

an n-well, an n-type first region and a p-type field implant diffusion formed in the substrate, the field implant diffusion being between the first region and the n-well, an n-type second region residing in the n-well such that the first and second regions are separated by the n-well and the field implant diffusion;

a metal gate electrode overlying the field implant diffusion, the metal gate electrode being electrically insulated from the field implant diffusion and electrically connecting the first region to ground;

an electrode contacting the second region so as to electrically connect the second region and the n-well to the CMOS integrated circuit;

an n-channel MGFO device having a source region formed by the first region, a drain region formed by the n-well, and a gate formed by the metal gate electrode; and an NPN device having an emitter region formed by the first region, a collector region formed by the n-well, and a base region formed by the substrate;

wherein the n-well and the substrate define a junction therebetween for the MGFO and NPN devices, and wherein the field implant diffusion and the n-well overlap at the junction so as to yield a breakdown voltage for the voltage clamp of at least 40 Vdc.

7. A voltage clamp as recited in claim 6 wherein the field implant diffusion and the n-well overlap at the junction by about 4.4 micrometers.

8. A voltage clamp as recited in claim 6 wherein the breakdown voltage of the voltage clamp is less than 62 Vdc.

9. A voltage clamp as recited in claim 6 wherein the voltage clamp withstands an electrostatic discharge pulse of at least 8000 Vdc.

* * * * *